United States Patent
Hong et al.

(10) Patent No.: US 8,771,442 B2
(45) Date of Patent: Jul. 8, 2014

(54) CYCLIC OLEFIN COMPOSITIONS FOR TEMPORARY WAFER BONDING

(75) Inventors: Wenbin Hong, Rolla, MO (US); Dongshun Bai, Rolla, MO (US); Tony D. Flaim, St. James, MO (US); Rama Puligadda, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 13/548,674

(22) Filed: Jul. 13, 2012

(65) Prior Publication Data

US 2012/0291938 A1 Nov. 22, 2012

Related U.S. Application Data

(62) Division of application No. 12/969,367, filed on Dec. 15, 2010, now Pat. No. 8,221,571, which is a division of application No. 12/263,120, filed on Oct. 31, 2008, now Pat. No. 8,092,628.

(51) Int. Cl.
| | | |
|---|---|---|
| C08L 65/00 | (2006.01) | |
| C09J 123/00 | (2006.01) | |
| B32B 37/00 | (2006.01) | |
| C08G 77/14 | (2006.01) | |
| C08G 73/10 | (2006.01) | |

(52) U.S. Cl.
USPC ............... 156/60; 156/247; 156/155; 528/33; 528/170; 438/458; 438/107; 438/455; 428/141

(58) Field of Classification Search
CPC ... C08L 65/00; C09J 123/0823; C09J 123/00; C08G 77/14; C08G 73/10; H01L 21/187
USPC ............... 257/499; 156/155, 60, 247; 528/33, 528/170; 428/141; 438/455, 107, 458
See application file for complete search history.

(56) References Cited

U.S. PATENT DOCUMENTS

| | | | |
|---|---|---|---|
| 3,868,433 A | 2/1975 | Bartz et al. ...................... 525/78 |
| 3,959,062 A | 5/1976 | Hoh et al. ...................... 156/313 |
| 3,970,494 A | 7/1976 | Pritchard ...................... 438/464 |
| 3,987,122 A | 10/1976 | Bartz et al. ...................... 525/193 |
| 4,474,942 A | 10/1984 | Sano et al. ...................... 528/363 |
| 4,558,114 A | 12/1985 | Goel ...................... 528/73 |
| 4,710,542 A | 12/1987 | Forgione et al. ............... 525/127 |
| 4,793,337 A | 12/1988 | Freeman et al. ............... 602/56 |
| 5,043,250 A | 8/1991 | West et al. ................... 430/278.1 |
| 5,087,677 A | 2/1992 | Brekner et al. ............... 526/160 |
| 5,191,026 A | 3/1993 | Nishi et al. ................... 525/332.1 |
| 5,602,219 A | 2/1997 | Aulbach et al. ............... 526/160 |
| 5,698,645 A | 12/1997 | Weller et al. .................. 526/160 |
| 5,773,561 A | 6/1998 | Sachdev et al. ............... 528/353 |
| 5,888,650 A | 3/1999 | Calhoun et al. ............... 428/354 |
| 6,008,298 A | 12/1999 | Hatke et al. ................... 525/210 |
| 6,045,967 A | 4/2000 | Jung et al. ................... 130/270.1 |
| 6,054,363 A | 4/2000 | Sakaguchi .................... 438/406 |
| 6,110,999 A | 8/2000 | Ourth et al. ................... 524/114 |
| 6,156,820 A | 12/2000 | Choi ............................ 523/176 |
| 6,235,818 B1 | 5/2001 | Morizono et al. .............. 524/77 |
| 6,440,259 B1 | 8/2002 | Patel ............................ 156/332 |
| 6,475,629 B1 | 11/2002 | Takeuchi et al. .............. 428/450 |
| 6,548,579 B2 | 4/2003 | Reski et al. .................... 524/47 |
| 6,590,047 B1 | 7/2003 | Chan et al. .................... 526/160 |
| 6,639,021 B2 | 10/2003 | Oshima et al. ............. 526/326.5 |
| 6,828,020 B2 | 12/2004 | Fisher et al. ............ 428/355 EN |
| 6,858,667 B1 | 2/2005 | Flerlage et al. ............... 524/504 |
| 6,869,894 B2 | 3/2005 | Moore .......................... 438/782 |
| 6,916,681 B2 | 7/2005 | Asano et al. .................... 438/99 |
| 6,933,342 B2 | 8/2005 | Parg et al. ....................... 525/83 |
| 7,084,201 B2 | 8/2006 | Garfield et al. ............... 524/575 |
| 7,098,152 B2 | 8/2006 | Moore .......................... 438/782 |
| 7,208,334 B2 | 4/2007 | Asakawa et al. ................ 438/29 |
| 7,288,316 B2 | 10/2007 | Jester .......................... 428/349 |
| 7,316,844 B2 | 1/2008 | Li et al. ....................... 428/421 |
| 7,445,881 B2 | 11/2008 | Asakawa et al. ........... 430/270.1 |
| 7,678,861 B2 | 3/2010 | Moore et al. .................. 524/571 |
| 2002/0115263 A1 | 8/2002 | Worth et al. .................. 438/455 |
| 2002/0127821 A1 | 9/2002 | Ohya et al. .................... 438/459 |
| 2003/0149207 A1 | 8/2003 | Walter et al. .................. 526/259 |
| 2003/0168158 A1 | 9/2003 | Kato ............................ 156/247 |

(Continued)

FOREIGN PATENT DOCUMENTS

| | | | |
|---|---|---|---|
| CA | 200834795 | 8/2008 | ............. C09J 109/00 |
| EP | 0133357 | 2/1985 | ............. C08L 101/02 |
| EP | 1 700 896 | 9/2006 | ............. C09J 11/06 |
| WO | WO 91/06587 | 5/1991 | ............. C08F 230/02 |
| WO | WO2006/093639 | 9/2006 | ............. H01L 21/68 |
| WO | WO2007/032537 | 3/2007 | ............. B29C 41/24 |
| WO | WO2008/045669 | 4/2008 | ............. H01L 21/304 |
| WO | WO 2009/094558 | 7/2009 | ............. H01L 23/12 |

OTHER PUBLICATIONS

Suga et al., Semiconductor Wafer Bonding 10: Science, Technology, and Applications, The Electrochemical Society, vol. 16 No. 8, 2008, pp. 105-115.*
d-limonene. A data sheet from the Compendium of Pesticide Common Names, 1 page, date unknown.
Safety (MSDS) date for Triton X-100, 1 page, date unknown.
ExxonMobil Chemical Vistalon, Vistalon 2504 Specifications, 2005, 1 page.

(Continued)

Primary Examiner — James J Seidleck
Assistant Examiner — Deve E Valdez
(74) Attorney, Agent, or Firm — Kusner & Jaffe

(57) ABSTRACT

New compositions and methods of using those compositions as bonding compositions are provided. The compositions comprise a cycloolefin copolymer dispersed or dissolved in a solvent system, and can be used to bond an active wafer to a carrier wafer or substrate to assist in protecting the active wafer and its active sites during subsequent processing and handling. The compositions form bonding layers that are chemically and thermally resistant, but that can also be softened or dissolved to allow the wafers to slide or be pulled apart at the appropriate stage in the fabrication process.

6 Claims, 5 Drawing Sheets

(56) References Cited

U.S. PATENT DOCUMENTS

| | | | |
|---|---|---|---|
| 2004/0185187 A1 | 9/2004 | Yokoyama et al. | 428/1.5 |
| 2004/0213994 A1 | 10/2004 | Kozakai et al. | 428/354 |
| 2004/0260021 A1 | 12/2004 | Macedo et al. | 525/63 |
| 2004/0266947 A1 | 12/2004 | Macedo et al. | 525/63 |
| 2005/0026071 A1 | 2/2005 | Lee | 430/270.1 |
| 2005/0084795 A1 | 4/2005 | Jung | 430/270.1 |
| 2005/0112337 A1 | 5/2005 | Jester | 428/200 |
| 2005/0164509 A1 | 7/2005 | Koshimizu et al. | 438/691 |
| 2005/0173064 A1 | 8/2005 | Miyanari | 156/703 |
| 2005/0181579 A1 | 8/2005 | Thallner | 438/455 |
| 2005/0191779 A1 | 9/2005 | Le Vaillant et al. | 438/24 |
| 2006/0003165 A1 | 1/2006 | Akatsuka et al. | 428/413 |
| 2006/0100403 A1 | 5/2006 | Yoon et al. | 526/218.1 |
| 2006/0141241 A1 | 6/2006 | Carespodi et al. | 428/327 |
| 2006/0183269 A1 | 8/2006 | Fuergut et al. | 438/106 |
| 2006/0234164 A1 | 10/2006 | Rhodes et al. | 430/311 |
| 2007/0134459 A1 | 6/2007 | Hubert et al. | 428/40.1 |
| 2007/0172669 A1 | 7/2007 | Amon et al. | 428/423.1 |
| 2007/0185310 A1 | 8/2007 | Moore et al. | 430/210 |
| 2007/0232026 A1 | 10/2007 | Apanius et al. | 438/460 |
| 2008/0073741 A1 | 3/2008 | Apanius et al. | 257/434 |
| 2008/0075901 A1 | 3/2008 | Lee et al. | 428/35.7 |
| 2008/0085979 A1 | 4/2008 | Ohkita | 526/87 |
| 2008/0152837 A1 | 6/2008 | Chien et al. | 427/536 |
| 2008/0173970 A1* | 7/2008 | Pillalamarri | 257/499 |
| 2008/0200011 A1 | 8/2008 | Pillalamarri et al. | 438/458 |
| 2009/0038750 A1* | 2/2009 | Hong et al. | 156/247 |
| 2010/0112305 A1 | 5/2010 | Hong et al. | 428/195.1 |

OTHER PUBLICATIONS

Material Safety Data Sheet, ExxonMobile Chemical Company, Vistalon Ethylene Propylene Rubber, Apr. 14, 2005, 1 page.

Ides, The Plastics Web, Zeonex 480R, 1 page, 2006, http://www.ides.com/grades/ds/E40300.htm, Sep. 13, 2006.

Eastman Product Data Sheet, Eastotack H-142W Resin, Sep. 13, 2006, 2 pages, http://www.eastman.com/ProductCatalogApps/PageControllers/ProdDatasheet_PC.aspx?p . . . .

Eastman H-142 Resin, Application Uses and Key Attributes, Sep. 13, 2006, 1 page, http://www.eastman.com/products/producthome.asp?product=71016204&SelectorUrl=%2. . . .

www.sigma-aldrich.com, 457531 Poly-a-pinene, Sep. 13 2006, http://www.sigma-aldrich.com/catalog/search/ProductDetail/ALDRICH/457531?PrtPrv=1 . . . .

Yi et al., "Synthesis and characterization of poly(amideimide)s containing aliphatic diamine moieties," Die Angewandte Makromolekulare Chemie, 233 (1995), pp. 89-101. (Abstract only).

Puligadda et al., "High-Performance Temporary Adhesives for Wafer Bonding Applications," Matter. Res. Soc. Symp. Proc., vol. 970, 2007.

Pillalamarri et al., "High-Temperature Spin-on Adhesives for Temporary Wafer Bonding," IMAPS 2006: Proceedings of the International Microelectronics and Packaging Society 39th International Symposium on Microelectronics, Oct. 8-12, 2006, pp. 105-111.

Rivas et al., "Thermal Degradation of Copolymers Based on 2-Substituted Oxazoline and β-Methylhydrogenitaconate," Polymer Bulletin, vol. 33, pp. 97-101 (1994).

Boustedt et al., "Flip Chip as an Enabler for MEMS Packaging," 2002, 2002 IEEE Electronics Components and Technology Conference, pp. 124-128.

Watanabe et al., "Three-Component Negative-Type Photosensitive Polyimide Precursor Based o Poly(amic acid), a Crosslinker, and a Photoacid Generator," Journal of Polymer Science: Part A, vol. 43, pp. 593-599 (2004).

Frump, "Oxazolines. Their preparation, reactions, and applications," Chem. Rev., 71 (5), 483-505, 1971.

Shin et al., "Chemical Structure and Physical Properties of Cyclic Olefin Copolymers," Pure Appl. Chem., vol. 77, No. 5, pp. 801-814, 2005.

Topas Advanced Polymers Company Information, information posted 2006 at www.topas.com, 10 pages.

Office Action dated Dec. 9, 2012 in corresponding U.S. Appl. No. 12/263,120, filed Oct. 31, 2008.

Smith et al., "A Chemical and Thermal Resistant Water Bonding Adhesive Simplifying Wafer Backside Processing," CS MANTECH Conference, Apr. 2006, Vancouver, British Columbia, Canada, 269-271.

Chamran et al., "3-Dimensional Electrodes for Microbatteries," Proceedings of IMECD04, ASME International Mechanical Engineering Congress and Exposition, Anaheim, CA, Nov. 13-20, 2004, paper IMECE2004-61925.

Charlton et al., "Fabrication of High Aspect Raito Silicon Microstructure by Anodic Etching," Journal of Micromechanics and Microengineering, vol. 7, No. 3, 1997, 155-158.

International Search Report and Written Opinion dated Jan. 14, 2001, in related application PCT/US2010/027937 filed on Mar. 19, 2010.

Office Action dated May 5, 2011 in corresponding U.S. Appl. No. 12/263,120, filed Oct. 31, 2008.

Buna EP T 6250, Lanxess, Lanxess Deutschland GmbH, Business unit Technical Rubber Products, Product Data Sheet, date unknown.

Eastman, Eastotac, http://www.eastman.com/brands/eastotac/producthome.asp?product=71016204, date unknown.

Eastman, Product Data Sheet, Eastotac Resin H-142W, http://eastman.com/productcatalogapps/pagecontrollers/proddatasheet_PC.aspx?, date unknown.

Niklaus et al., "Adhesive Wafer Bonding," J. Appl. Phys., 2006, 99, 031101.

Moore et al., "High Temperature Resistant Adhesive for Wafer Thinning and Backside Processing," MANTECH 2004, 8.10, 4 pages.

Brubaker et al., "Advances in processing of Compound Semiconductor Substrates," MANTECH 2005, 4 pages.

Combe et al., "Reversible Wafer Bonding: Challenges in Ramping up 150mm GaAs Wafer Production to Meet Growing Demand," MANTECH 2006, 4 pages.

Kwon et al., "An Evaluation Process of Polymeric Adhesive Wafer Bonding for Vertical System Integration," Japanese Journal of Applied Physics, vol. 44, No. 6A, 2005, pp. 3893-3902.

Technical DataSheet Abstract Ebecryl 169, UCB Chemicals, Additive, Adhesion promoter/Bonding agent, 2006 SpecialChem S.A., 1 page, http://www.specialchem4coatings.com/common/pc/product/displayproduct.aspx?id=12887&srchid=22051.

MatWeb, The Online Material Database: Zeon Chemicals Zeonex 480R Cyclo Olefin Optical Grade Polymer; Subcategory: Cyclo Olefin Polymer, Polymer, Thermoplastic, 2006, 1 page, http://www.matweb.com/search/SpecificMaterialPring.asp?bassnum=PZEON6.

Niklaus, Adhesive Wafer Bonding Technology, Department of Signals, Sensors and Systems, Royal Institute of Technology (KTH), Stockholm, Sweden, Copyright 2002, 33 pages.

Grunsven et al., "Wafer Level Chip Size Packaging Technology for Power Device Using Low Ohmic Through-Hole Vias," 14th European Microelectronics and Packaging Conference and Exhibition, Germany, Jun. 23-25 2003, pp. 46-50.

Fukushima et al., "New Three-Dimensional Integration Technology Using Chip-to-Wafer Bonding to Archive Ultimate Super-Chip Integration," The Japan Society of Applied Physics, vol. 43, Mo. 4B, 2006, 3030-3035.

Library 4 Science, Pinene, 2006, 1 page, http://www.chromatography-online.org/topics/pinene.html.

Technical Datasheet Abstract Vanax 808 HP, R.T. Vanderbilt, Additive, Crosslinking Catalyst/Accelerator/Initiator>>Amine or Nitrogen Content, 2006, SpecialChem S.A., 2006, 1 page, http://www.specialchem4polymers.com/common/pa/product/displayproduct.aspx?id=7815&srchid=292522.

Ciba Specialty Chemicals, Additives, Polymer Adeditives, Ciba IRGANOX 1010, Phenolic Primary Antioxidant for Processing and Long-Term Thermal Stabilization, Oct. 1999, 2 pages.

Chiba Speciality Chemicals, Additives, Polymer Additives, Ciba IRGAFOS 168, Hydrolytically Stable Phosphite Processing Stabilizer, Sep. 1999, 2 pages.

Chemical Land 21, Organic Chemicals, Mesitylene, 1 page, date unknown.

International Search Report and Written Opinion dated May 12, 2010, in corresponding PCT/US2009/061633 filed on Oct. 22, 2009.

Clugston, M.J. (Ed.), "The New Penguin Dictionary of Science," 1998, p. 150, paragraph 10.

* cited by examiner

CYCLIC OLEFIN COMPOSITIONS FOR TEMPORARY WAFER BONDING

RELATED APPLICATIONS

This application is a divisional application of U.S. patent application Ser. No. 12/969,367, filed Dec. 15, 2010 now U.S. Pat. No. 8,221,571, which is a divisional of U.S. patent application Ser. No. 12/263,120, filed Oct. 31, 2008 now U.S. Pat. No. 8,092,628, said patent applications hereby fully incorporated herein by reference.

GOVERNMENT FUNDING

This invention was made with government support under contract number N00014-07-C-0797 awarded by the Office of Navel Research (ONR). The United States Government has certain rights in the invention.

BACKGROUND OF THE INVENTION

1. Field of the Invention

The present invention is broadly concerned with novel compositions and methods of using those compositions to form bonding compositions that can support active wafers on a carrier wafer or substrate during wafer thinning and other processing.

2. Description of the Prior Art

Wafer (substrate) thinning has been used to dissipate heat and aid in the electrical operation of integrated circuits (IC). Thick substrates cause an increase in capacitance, requiring thicker transmission lines, and, in turn, a larger IC footprint. Substrate thinning increases impedance while capacitance decreases impedance, causing a reduction in transmission line thickness, and, in turn, a reduction in IC size. Thus, substrate thinning facilitates IC miniaturization.

Geometrical limitations are an additional incentive for substrate thinning. Via holes are etched on the backside of a substrate to facilitate frontside contacts. In order to construct a via using common dry-etch techniques, geometric restrictions apply. For substrate thicknesses of less than 100 µm, a via having a diameter of 30-70 µm is constructed using dry-etch methods that produce minimal post-etch residue within an acceptable time. For thick substrates, vias with larger diameters are needed. This requires longer dry-etch times and produces larger quantities of post-etch residue, thus significantly reducing throughput. Larger vias also require larger quantities of metallization, which is more costly. Therefore, for backside processing, thin substrates can be processed more quickly and at lower cost.

Thin substrates are also more easily cut and scribed into ICs. Thinner substrates have a smaller amount of material to penetrate and cut and therefore require less effort. No matter what method (sawing, scribe and break, or laser ablation) is used, ICs are easier to cut from thinner substrates. Most semiconductor wafers are thinned after frontside operations. For ease of handling, wafers are processed (i.e., frontside devices) at their normal full-size thicknesses, e.g., 600-700 µm. Once completed, they are thinned to thicknesses of 100-150 µm. In some cases (e.g., when hybrid substrates such as gallium arsenide (GaAs) are used for high-power devices) thicknesses may be taken down to 25 µm.

Mechanical substrate thinning is performed by bringing the wafer surface into contact with a hard and flat rotating horizontal platter that contains a liquid slurry. The slurry may contain abrasive media along with chemical etchants such as ammonia, fluoride, or combinations thereof. The abrasive provides "gross" substrate removal, i.e., thinning, while the etchant chemistry facilitates "polishing" at the submicron level. The wafer is maintained in contact with the media until an amount of substrate has been removed to achieve a targeted thickness.

For a wafer thickness of 300 µm or greater, the wafer is held in place with tooling that utilizes a vacuum chuck or some means of mechanical attachment. When wafer thickness is reduced to less than 300 µm, it becomes difficult or impossible to maintain control with regard to attachment and handling of the wafer during further thinning and processing. In some cases, mechanical devices may be made to attach and hold onto thinned wafers, however, they are subject to many problems, especially when processes may vary. For this reason, the wafers ("active" wafers) are mounted onto a separate rigid (carrier) substrate or wafer. This substrate becomes the holding platform for further thinning and post-thinning processing. Carrier substrates are composed of materials such as sapphire, quartz, certain glasses, and silicon, and usually exhibit a thickness of 1000 µm. Substrate choice will depend on how closely matched the coefficient of thermal expansion (CTE) is between each material. However, most of the currently available adhesion methods do not have adequate thermal or mechanical stability to withstand the high temperatures encountered in backside processing steps, such as metallization or dielectric deposition and annealing. Many current methods also have poor planarity (which contributes excessive total thickness variation across the wafer dimensions), and poor chemical resistance.

One method that has been used to mount an active wafer to a carrier substrate is via a thermal release adhesive tape. This process has two major shortcomings. First, the tapes have limited thickness uniformity across the active wafer/carrier substrate interface, and this limited uniformity is often inadequate for ultra-thin wafer handling. Second, the thermal release adhesive softens at such low temperatures that the bonded wafer/carrier substrate stack cannot withstand many typical wafer processing steps that are carried out at higher temperatures.

Thermally stable adhesives, on the other hand, often require excessively high bonding pressures or bonding temperatures to achieve sufficient melt flow for good bond formation to occur. Likewise, too much mechanical force may be needed to separate the active wafer and carrier wafer because the adhesive viscosity remains too high at practical debonding temperatures. Thermally stable adhesives can also be difficult to remove without leaving residues.

There is a need for new compositions and methods of adhering an active wafer to a carrier substrate that can endure high processing temperatures and that allow for ready separation of the wafer and substrate at the appropriate stage of the process.

SUMMARY OF THE INVENTION

The present invention overcomes the problems of the prior art by broadly providing a wafer bonding method, which includes providing a stack comprising first and second substrates bonded together via a bonding layer, and separating the first and second substrates. The bonding layer is formed from a composition comprising a cycloolefin copolymer (COC) dissolved or dispersed in a solvent system.

The invention also provides an article comprising first and second substrates and a bonding layer. The first substrate comprises a back surface and an active surface, which comprises at least one active site and a plurality of topographical features. The second substrate has a bonding surface. The bonding layer is bonded to the active surface of the first substrate and to the bonding surface of the second substrate. The bonding layer is formed from a composition comprising a cycloolefin copolymer dissolved or dispersed in a solvent system.

In a further embodiment, the invention is concerned with a composition useful for bonding two substrates together. The inventive composition comprises a cycloolefin copolymer and an ingredient dissolved or dispersed in a solvent system. The ingredient is selected from the group consisting of tackifier resins, low molecular weight cycloolefin copolymers, and mixtures thereof.

BRIEF DESCRIPTION OF THE DRAWINGS

Figure (FIG.) 1 illustrates the inventive method of thinning and debonding two wafers according to the present invention.

DETAILED DESCRIPTION OF THE PREFERRED EMBODIMENTS

Figure 1:
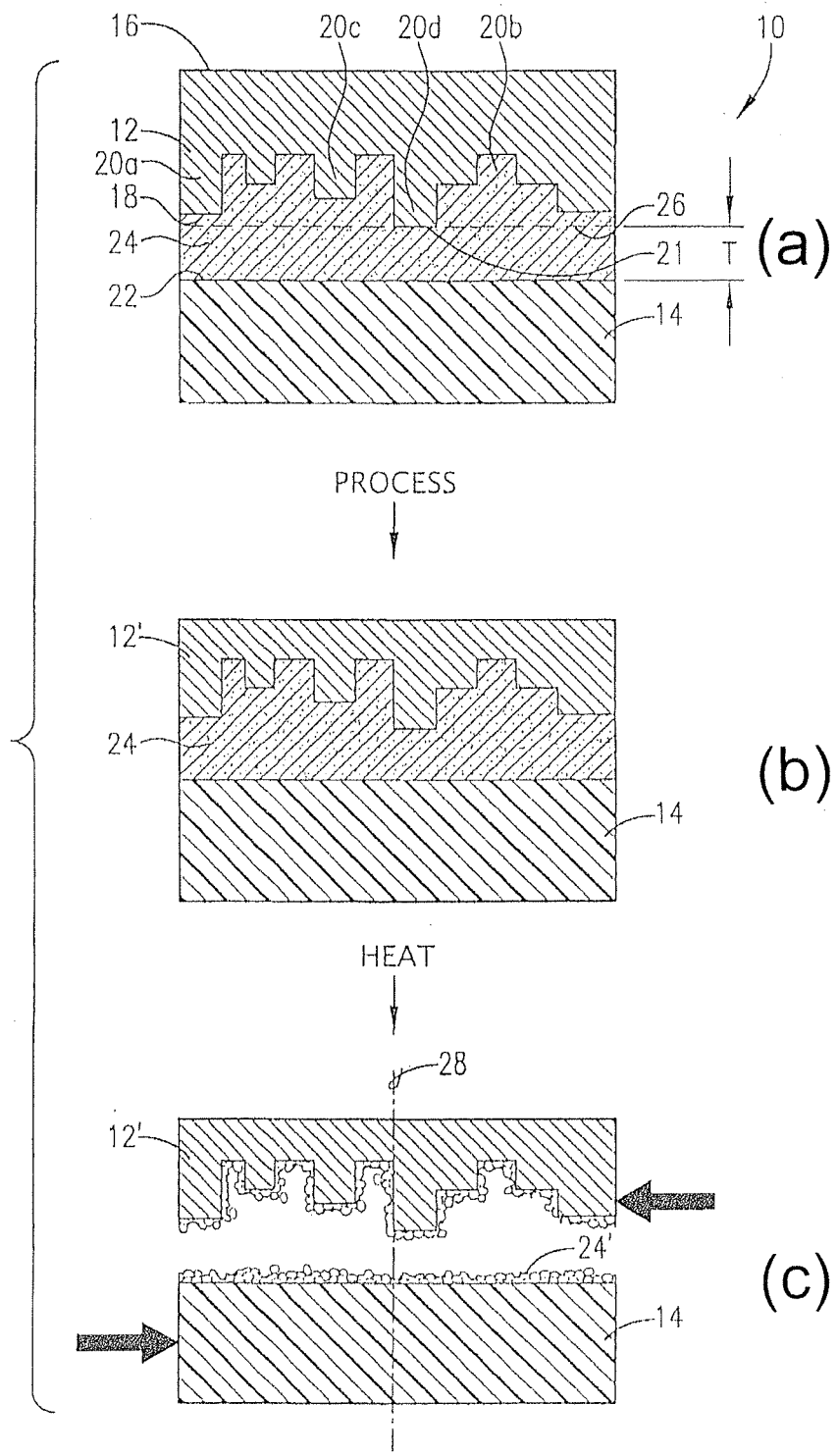

In more detail, the inventive compositions comprise a cycloolefin copolymer (COC) dispersed or dissolved in a solvent system. The copolymer is preferably present in the composition at levels of from about 5% to about 85% by weight, more preferably from about 5% to about 60% by weight, and most preferably from about 10% to about 40% by weight, based upon the total weight of the composition taken as 100% by weight.

The preferred copolymers are thermoplastic and preferably have a weight average molecular weight ($M_W$) of from about 2,000 Daltons to about 200,000 Daltons, and more preferably from about 5,000 Daltons to about 100,000 Daltons. Preferred copolymers preferably have a softening temperature (melt viscosity at 3,000 Pa·S) of at least about 100° C., more preferably at least about 140° C., and even more preferably from about 160° C. to about 220° C. Suitable copolymers also preferably have a glass transition temperature ($T_g$) of at least about 60° C., more preferably from about 60° C. to about 200° C., and most preferably from about 75° C. to about 160° C.

Preferred cycloolefin copolymers are comprised of recurring monomers of cyclic olefins and acyclic olefins, or ring-opening polymers based on cyclic olefins. Suitable cyclic olefins for use in the present invention are selected from the group consisting of norbornene-based olefins, tetracyclododecene-based olefins, dicyclopentadiene-based olefins, and derivatives thereof. Derivatives include alkyl (preferably $C_1$-$C_{20}$ alkyls, more preferably $C_1$-$C_{10}$ alkyls), alkylidene (preferably $C_1$-$C_{20}$ alkylidenes, more preferably $C_1$-$C_{10}$ alkylidenes), aralkyl (preferably $C_6$-$C_{30}$ aralkyls, more preferably $C_6$-$C_{18}$ aralkyls), cycloalkyl (preferably $C_3$-$C_{30}$ cycloalkyls, more preferably $C_3$-$C_{18}$ cycloalkyls), ether, acetyl, aromatic, ester, hydroxy, alkoxy, cyano, amide, imide, and silyl-substituted derivatives. Particularly preferred cyclic olefins for use in the present invention include those selected from the group consisting of

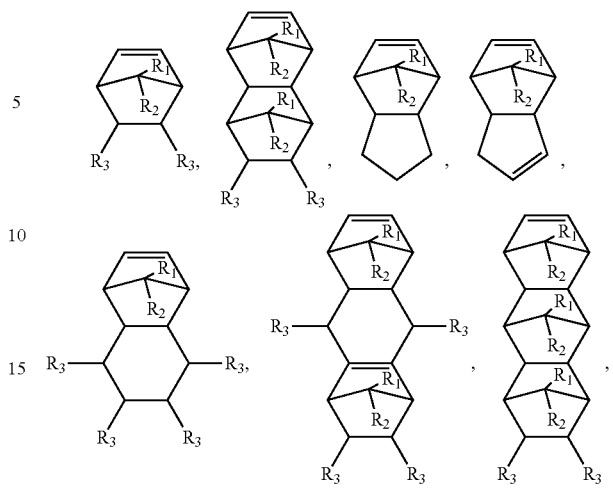

and combinations of the foregoing, where each $R_1$ and $R_2$ is individually selected from the group consisting of —H, and alkyl groups (preferably $C_1$-$C_{20}$ alkyls, more preferably $C_1$-$C_{10}$ alkyls), and each $R_3$ is individually selected from the group consisting of —H, substituted and unsubstituted aryl groups (preferably $C_6$-$C_{18}$ aryls), alkyl groups (preferably $C_1$-$C_{20}$ alkyls, more preferably $C_1$-$C_{10}$ alkyls), cycloalkyl groups (preferably $C_3$-$C_{30}$ cycloalkyl groups, more preferably $C_3$-$C_{18}$ cycloalkyl groups), aralkyl groups (preferably $C_6$-$C_{30}$ aralkyls, more preferably $C_6$-$C_{18}$ aralkyl groups such as benzyl, phenethyl, and phenylpropyl, etc.), ester groups, ether groups, acetyl groups, alcohols (preferably $C_1$-$C_{10}$ alcohols), aldehyde groups, ketones, nitriles, and combinations thereof.

Preferred acyclic olefins are selected from the group consisting of branched and unbranched $C_2$-$C_{20}$ alkenes (preferably $C_2$-$C_{10}$ alkenes). More preferably, suitable acyclic olefins for use in the present invention have the structure

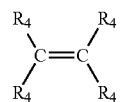

where each $R_4$ is individually selected from the group consisting of —H and alkyl groups (preferably $C_1$-$C_{20}$ alkyls, more preferably $C_1$-$C_{10}$ alkyls). Particularly preferred acyclic olefins for use in the present invention include those selected from the group consisting of ethene, propene, and butene, with ethene being the most preferred.

Methods of producing cycloolefin copolymers are known in the art. For example, cycloolefin copolymers can be produced by chain polymerization of a cyclic monomer with an acyclic monomer (such as norbornene with ethene as shown below).

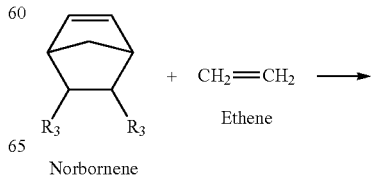

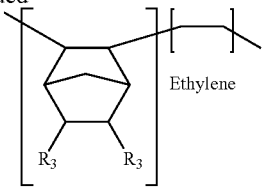

Norbornanediyl

The reaction shown above results in an ethene-norbornene copolymer containing alternating norbornanediyl and ethylene units. Examples of copolymers produced by this method include TOPAS®, produced by Goodfellow Corporation and TOPAS Advanced Polymers, and APEL®, produced by Mitsui Chemicals. A suitable method for making these copolymers is disclosed in U.S. Pat. No. 6,008,298, incorporated by reference herein.

Cycloolefin copolymers can also be produced by ring-opening metathesis polymerization of various cyclic monomers followed by hydrogenation as illustrated below.

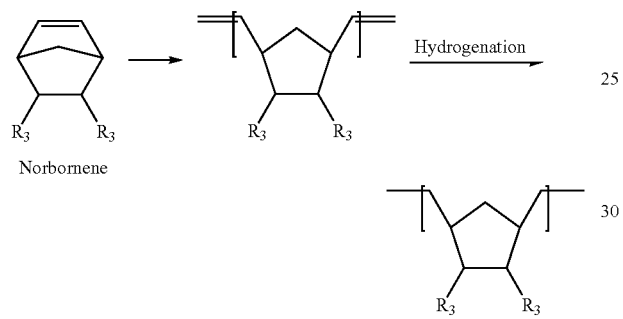

Norbornene

The polymers resulting from this type of polymerization can be thought of conceptually as a copolymer of ethene and a cyclic olefin monomer (such as alternating units of ethylene and cyclopentane-1,3-diyl as shown below).

Ethylene

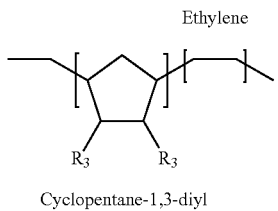

Cyclopentane-1,3-diyl

Examples of copolymers produced by this method include ZEONOR® from Zeon Chemicals, and ARTON® from JSR Corporation. A suitable method of making these copolymers is disclosed in U.S. Pat. No. 5,191,026, incorporated by reference herein.

Accordingly, copolymers of the present invention preferably comprise recurring monomers of:

(I)

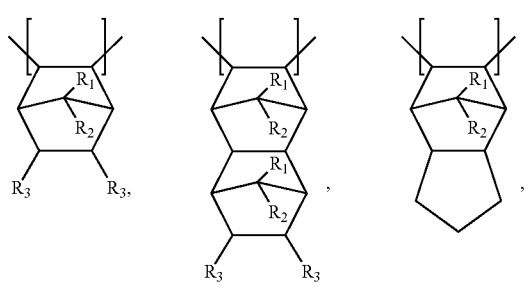

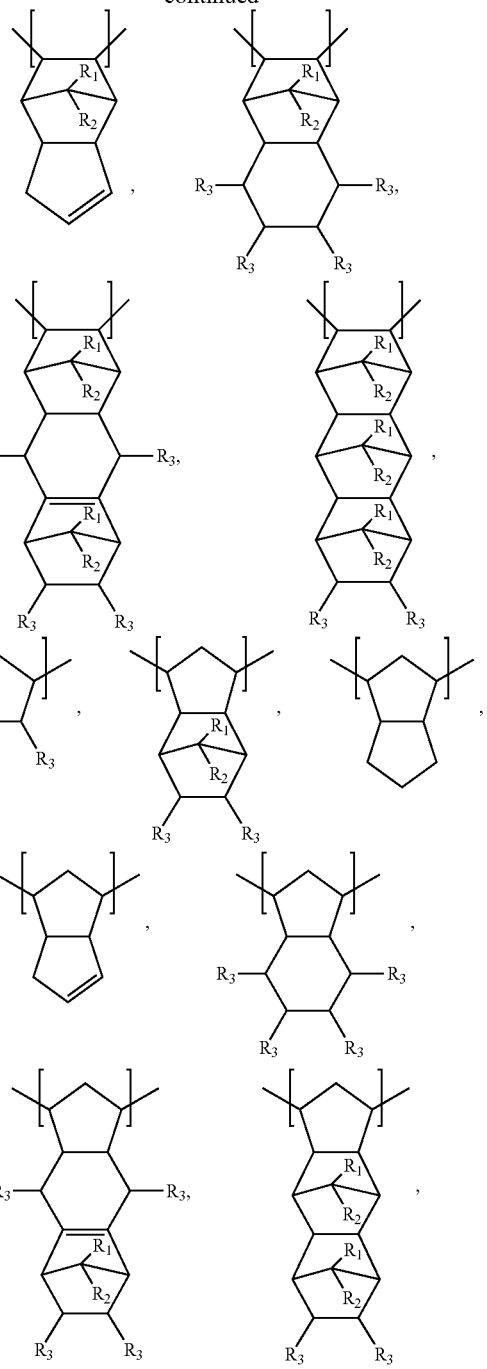

and combinations of the foregoing, where:

each $R_1$ and $R_2$ is individually selected from the group consisting of —H, and alkyl groups (preferably $C_1$-$C_{20}$ alkyls, more preferably $C_1$-$C_{10}$ alkyls), and each $R_3$ is individually selected from the group consisting of —H, substituted and unsubstituted aryl groups (preferably $C_6$-$C_{18}$ aryls), alkyl groups (preferably $C_1$-$C_{20}$ alkyls, more preferably $C_1$-$C_{10}$ alkyls), cycloalkyl groups (preferably $C_3$-$C_{30}$ cycloalkyl groups, more preferably $C_3$-$C_{18}$ cycloalkyl groups), aralkyl groups (preferably $C_6$-$C_{30}$ aralkyls, more preferably $C_6$-$C_{18}$ aralkyl groups, such as benzyl, phenethyl, and phenylpropyl, etc.), ester groups, ether groups, acetyl groups, alcohols (preferably $C_1$-$C_{10}$ alcohols), aldehyde groups, ketones, nitriles, and combinations thereof;
and

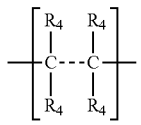

(II)

where:
- - - - - is a single or double-bond; and
each $R_4$ is individually selected from the group consisting of —H and alkyl groups (preferably $C_1$-$C_{20}$ alkyls, more preferably $C_1$-$C_{10}$ alkyls).

The ratio of monomer (I) to monomer (II) within the polymer is preferably from about 5:95 to about 95:5, and more preferably from about 30:70 to about 70:30.

The inventive compositions are formed by simply mixing the cycloolefin copolymer and any other ingredients with the solvent system, preferably at room temperature to about 150° C., for time periods of from about 1-72 hours.

The composition should comprise at least about 15% by weight solvent system, preferably from about 30% to about 95% by weight solvent system, more preferably from about 40% to about 90% by weight solvent system, and even more preferably from about 60% to about 90% by weight solvent system, based upon the total weight of the composition taken as 100% by weight. The solvent system should have a boiling point of from about 50-280° C., and preferably from about 120-250° C. Suitable solvents include, but are not limited to, methyl ethyl ketone (MEK) and cyclopentanone, as well as hydrocarbon solvents selected from the group consisting of limonene, mesitylene, dipentene, pinene, bicyclohexyl, cyclododecene, 1-tert-butyl-3,5-dimethylbenzene, butylcyclohexane, cyclooctane, cycloheptane, cyclohexane, methylcyclohexane, and mixtures thereof.

The total solids level in the composition should be at least about 5% by weight, preferably from about 5% to about 85% by weight, more preferably from about 5% to about 60% by weight, and even more preferably from about 10% to about 40% by weight, based upon the total weight of the composition taken as 100% by weight.

According to the invention, the composition can include additional ingredients, including low molecular weight cycloolefin copolymer (COC) resins and/or tackifier resins or rosins. The composition can also include a number of optional ingredients selected from the group consisting of plasticizers, antioxidants, and mixtures thereof.

When a low molecular weight COC resin is used in the composition, it is preferably present in the composition at a level of from about 2% to about 80% by weight, more preferably from about 5% to about 50% by weight, and even more preferably from about 15% to about 35% by weight, based upon the total weight of the composition taken as 100% by weight. The term "low molecular weight cycloolefin copolymer" is intended to refer to COCs having a weight average molecular weight ($M_w$) of less than about 50,000 Daltons, preferably less than about 20,000 Daltons, and more preferably from about 500 to about 10,000 Daltons. Such copolymers also preferably have a $T_g$ of from about 50° C. to about 120° C., more preferably from about 60° C. to about 90° C., and most preferably from about 60° C. to about 70° C. Exemplary low molecular weight COC resins for use in the present compositions are those sold under the name TOPAS® Toner TM ($M_w$ 8,000), available from Topas Advanced Polymers.

When a tackifier or rosin is utilized, it is preferably present in the composition at a level of from about 2% to about 80% by weight, more preferably from about 5% to about 50% by weight, and even more preferably from about 15% to about 35% by weight, based upon the total weight of the composition taken as 100% by weight. The tackifiers are chosen from those having compatible chemistry with the cycloolefin copolymers so that no phase separation occurs in the compositions. Examples of suitable tackifiers include, but are not limited to, polyterpene resins (sold under the name SYLVARES™ TR resin; Arizona Chemical), beta-polyterpene resins (sold under the name SYLVARES™ TR-B resin; Arizona Chemical), styrenated terpene resins (sold under the name ZONATAC NG resin; Arizona Chemical), polymerized rosin resins (sold under the name SYLVAROS® PR resin; Arizona Chemical), rosin ester resins (sold under the name EASTOTAC™ resin; Eastman Chemical), cyclo-aliphatic hydrocarbon resins (sold under the name PLASTOLYN™ resin; Eastman Chemical, or under the name ARKON™ resin; Arakawa Chemical), C5 aliphatic hydrocarbon resins (sold under the name PICCOTAC™ resin; Eastman Chemical), hydrogenated hydrocarbon resins (sold under the name REGALITE™ resin; Eastman Chemical), and mixtures thereof.

When an antioxidant is utilized, it is preferably present in the composition at a level of from about 0.1% to about 2% by weight, and more preferably from about 0.5% to about 1.5% by weight, based upon the total weight of the composition taken as 100% by weight. Examples of suitable antioxidants include those selected from the group consisting of phenolic antioxidants (such as pentaerythritol tetrakis(3-(3,5-di-tert-butyl-4-hydroxyphenyl)propionate sold under the name IRGANOX® 1010 by Ciba), phosphite antioxidants (such as tris(2,4-ditert-butylphenyl)phosphite sold under the name IRGAFOS® 168 by Ciba), phosphonite antioxidants (such as tetrakis(2,4-di-tert-butylphenyl)[1,1-biphenyl]-4,4'-diylbis-phosphonite sold under the name IRGANOX® P-EPQ by Ciba), and mixtures thereof.

In alternative embodiments, it is preferred that the compositions are essentially free (less than about 0.1% and preferably about 0% by weight) of adhesion promoting agents, such as bis(trimethoxysilylethyl)benzene, aminopropyl tri(alkoxy silanes) (e.g., aminopropyl tri(methoxy silane), aminopropyl tri(ethoxy silanes), -phenyl aminopropyl tri(ethoxy silane)), and other silane coupling agents, or mixtures thereof. In some embodiments, the final composition is also thermoplastic (i.e., noncrosslinkable). Thus, in these alternative embodiments, the composition will be essentially free (less than about 0.1% by weight and preferably about 0% by weight) of crosslinking agents, such as POWDERLINK® by Cytec, and EPI-CURE™ 3200 by Hexion Specialty Chemicals.

According to one aspect, the melt viscosity (complex coefficient of viscosity) of the final composition will preferably be less than about 100 Pa·S, more preferably less than about 50 Pa·S, and even more preferably from about 1 Pa·S to about 35 Pa·S. For purposes of these measurements, the melt viscosity is determined via rheological dynamic analysis (TA Instruments, AR-2000, two parallel-plate configuration where the plates have a diameter of 25 mm). Furthermore, the melt viscosity is preferably determined at the preferred debonding temperature of the composition in question. As used herein, the term "preferred debonding temperature" of the composition is defined as the temperature at which the melt viscosity of the composition is below 100 Pa·S, and is determined by dynamic measurement at 1 Hz oscillation frequency in temperature ramp. The compositions also preferably have a storage modulus (G') of less than about 100 Pa, preferably less than about 50 Pa, and even more preferably from about 1 Pa to about 26 Pa, when measured at the preferred debonding temperature of the composition. The storage modulus is determined by dynamic measurement at 1 Hz oscillation frequency in temperature ramp.

The compositions are thermally stable up to about 350° C. There is also preferably less than about 5% by weight, and more preferably less than about 1.5% by weight, loss of the composition after one hour at the preferred debonding temperature plus 50° C. (preferably at a temperature of from about 200° C. to about 300° C.), depending upon the composition. In other words, very little to no thermal decomposition occurs in the composition at this temperature, as determined by thermogravimetric analysis (TGA), described herein.

Although the composition could be applied to either the carrier substrate or active wafer first, it is preferred that it be applied to the active wafer first. These compositions can be coated to obtain void-free thick films required for bump wafer applications and to achieve the required uniformity across the wafer. A preferred application method involves spin-coating the composition at spin speeds of from about 500-5000 rpm (more preferably from about 1000-3500 rpm), at accelerations of from about 3000-10,000 rpm/second, and for spin times of from about 30-180 seconds. It will be appreciated that the application steps can be varied to achieve a particular thickness.

After coating, the substrate can be baked (e.g., on a hot plate) to evaporate the solvents. Typical baking would be at temperatures of from about 70-250° C., and preferably from about 80-240° C. for a time period of from about 1-60 minutes, and more preferably from about 2-10 minutes. The film thickness (on top of the topography) after bake will typically be at least about 1 µm, and more preferably from about 10-200 µm.

After baking, the desired carrier wafer is contacted with, and pressed against, the layer of inventive composition. The carrier wafer is bonded to this inventive composition by heating at a temperature of from about 100-300° C., and preferably from about 120-180° C. This heating is preferably carried out under vacuum and for a time period of from about 1-10 minutes, under a bond force of from about 0.1 to about 25 kiloNewtons. The bonded wafer can be subjected to backgrinding, metallization, patterning, passivation, via forming, and/or other processing steps involved in wafer thinning, as explained in more detail below.

FIG. 1(a) illustrates an exemplary stack 10 comprising active wafer 12 and carrier wafer or substrate 14. It will be appreciated that stack 10 is not shown to scale and has been exaggerated for the purposes of this illustration. Active wafer 12 has an active surface 18. As shown in FIG. 1(a), active surface 18 can comprise various topographical features 20a-20d. Typical active wafers 12 can include any microelectronic substrate. Examples of some possible active wafers 12 include those selected from the group consisting of microelectromechanical system (MEMS) devices, display devices, flexible substrates (e.g., cured epoxy substrates, roll-up substrates that can be used to form maps), compound semiconductors, low k dielectric layers, dielectric layers (e.g., silicon oxide, silicon nitride), ion implant layers, and substrates comprising silicon, aluminum, tungsten, tungsten silicide, gallium arsenide, germanium, tantalum, tantalum nitrite, SiGe, and mixtures of the foregoing.

Carrier substrate 14 has a bonding surface 22. Typical carrier substrates 14 comprise a material selected from the group consisting of sapphire, ceramic, glass, quartz, aluminum, silver, silicon, glass-ceramic composites (such as products sold under the name Zerodur®, available from Schott AG), and combinations thereof.

Wafer 12 and carrier substrate 14 are bonded together via bonding composition layer 24. Bonding layer 24 is formed of the cycloolefin copolymer compositions described above, and has been applied and dried as also described above. As shown in the FIG. 1(a), bonding layer 24 is bonded to active surface 18 of wafer 12 as well as to bonding surface 22 of substrate 14. Unlike prior art tapes, bonding layer 24 is a uniform (chemically the same) material across its thickness. In other words, the entire bonding layer 24 is formed of the same composition.

It will be appreciated that, because bonding layer 24 can be applied to active surface 18 by spin-coating or spray-coating, the bonding composition flows into and over the various topographical features. Furthermore, the bonding layer 24 forms a uniform layer over the topography of active surface 18. To illustrate this point, FIG. 1 shows a plane designated by dashed line 26, at end portion 21 and substantially parallel to back surface 16. The distance from this plane to bonding surface 22 is represented by the thickness "T." The thickness "T" will vary by less than about 20%, preferably by less than about 10%, more preferably by less than about 5%, even more preferably by less than about 2%, and most preferably less than about 1% across the length of plane 26 and substrate 14.

The wafer package can then be subjected to subsequent thinning (or other processing) of the substrate as shown in FIG. 1(b), where 12' presents the wafer 12 after thinning. It will be appreciated that the substrates can be thinned to thicknesses of less than about 100 µm, preferably less than about 50 µm, and more preferably less than about 25 µm. After thinning, typical backside processing, including backgrinding, patterning (e.g., photolithography, via etching), passivation, and metallization, and combinations thereof, may be performed.

Advantageously, the dried layers of the inventive compositions possess a number of highly desirable properties. For example, the layers will exhibit low outgassing for vacuum etch processes. That is, if a 15-µm thick film of the composition is baked at 80-250° C. for 2-60 minutes (more preferably 2-4 minutes), the solvents will be driven from the composition so that subsequent baking at 140-300° C. for 2-4 minutes results in a film thickness change of less than about 5%, preferably less than about 2%, and even more preferably less than about 1.0% or even 0% (referred to as the "Film Shrinkage Test"). Thus, the dried layers can be heated to temperatures of up to about 350° C., preferably up to about 320° C., more preferably up to about 300° C., without chemical reactions occurring in the layer. In some embodiments, the layers can also be exposed to polar solvents (e.g., N-methyl-2-pyrrolidone) at a temperature of 80° C. for 15 minutes without reacting.

The bond integrity of the dried layers can be maintained even upon exposure to an acid or base. That is, a dried layer of the composition having a thickness of about 15 µm can be submerged in an acidic media (e.g., concentrated sulfuric acid) or base (e.g., 30 wt. % KOH) at 85° C. for about 45 minutes while maintaining bond integrity. Bond integrity can be evaluated by using a glass carrier substrate and visually observing the bonding composition layer through the glass carrier substrate to check for bubbles, voids, etc. Also, bond integrity is maintained if the active wafer and carrier substrate cannot be separated by hand.

After the desired processing has occurred, the active wafer or substrate can be separated from the carrier substrate. In one embodiment, the active wafer and substrate are separated by heating to a temperature sufficient to soften the bonding layer. More specifically, the stack is heated to temperatures of at least about 100° C., preferably at least about 120° C., and more preferably from about 150° C. to about 300° C. These temperature ranges represent the preferred debonding temperatures of the bonding composition layer. This heating will cause the bonding composition layer to soften and form softened bonding layer 24' as shown in FIG. 1(*c*), at which point the two substrates can be separated, for example, by sliding apart. FIG. 1(*c*) shows an axis 28, which passes through both of wafer 12 and substrate 14, and the sliding forces would be applied in a direction generally transverse to axis 28. Instead of sliding, wafer 12 or substrate 14 can be separated by lifting upward (i.e., in a direction that is generally away from the other of wafer 12 or substrate 14) to separate the wafer 12 from the substrate 14.

Alternatively, instead of heating to soften the layer, the bonding composition can be dissolved using a solvent. Once the layer is dissolved, the active wafer and substrate can be thereafter separated. Suitable solvents for use in dissolving the bonding layer can be any solvent that was part of the composition prior to drying, such as those selected from the group consisting of MEK and cyclopentanone, as well as hydrocarbon solvents selected from the group consisting of limonene, mesitylene, dipentene, pinene, bicyclohexyl, cyclododecene, 1-tert-butyl-3,5-dimethylbenzene, butylcyclohexane, cyclooctane, cycloheptane, cyclohexane, methylcyclohexane, and mixtures thereof.

Whether the bonding composition is softened or dissolved, it will be appreciated that separation can be accomplished by simply applying force to slide and/or lift one of wafer 12 or substrate 14 while maintaining the other in a substantially stationary position so as to resist the sliding or lifting force (e.g., by applying simultaneous opposing sliding or lifting forces to wafer 12 and substrate 14). This can all be accomplished via conventional equipment.

Any bonding composition remaining in the device areas can be easily removed by rinsing with a suitable solvent followed by spin-drying. Suitable solvents include the original solvent that was part of the composition prior to drying as well as those solvents listed above suitable for dissolving the composition during debonding. Any composition remaining behind will be completely dissolved (at least about 98%, preferably at least about 99%, and more preferably about 100%) after 5-15 minutes of exposure to the solvent. It is also acceptable to remove any remaining bonding composition using a plasma etch, either alone or in combination with a solvent removal process. After this step, a clean, bonding composition-free wafer 12' and carrier substrate 14 (not shown in their clean state) will remain.

EXAMPLES

The following examples set forth preferred methods in accordance with the invention. It is to be understood, however, that these examples are provided by way of illustration and nothing therein should be taken as a limitation upon the overall scope of the invention.

Example 1

Cycloolefin Copolymer Resin and Low Molecular Weight COC Resin Blends

In this Example, formulations containing cycloolefin copolymers and a low molecular weight COC resin were made. Antioxidants were added to some of the formulations.

1. Sample 1.1

In this procedure, 1.2 grams of an ethene-norbornene copolymer (TOPAS® 5010, $T_g$ 110° C.; obtained from TOPAS Advanced Polymers, Florence, Ky.) were dissolved in 6 grams of D-limonene (Florida Chemical Co.), along with 2.8 grams of a low molecular weight cycloolefin copolymer (TOPAS® Toner TM, $M_w$ 8,000, $M_w/M_n$ 2.0). The solution was allowed to stir at room temperature until the ingredients were in solution. The solution had about 40% solids.

2. Sample 1.2

In this procedure, 0.75 grams of an ethene-norbornene copolymer (TOPAS® 8007, $T_g$ 78° C.) and 3.25 grams of low molecular weight COC (TOPAS® Toner TM) were dissolved in 6 grams of D-limonene. The solution was allowed to stir at room temperature until the ingredients were in solution. The solution had about 40% solids.

3. Sample 1.3

For this procedure, 1.519 grams of an ethene-norbornene copolymer (TOPAS® 5013, $T_g$ 134° C.) were dissolved in 5.92 grams of D-limonene along with 2.481 grams of a low molecular weight cycloolefin copolymer (TOPAS® Toner TM), 0.04 grams of a phenolic antioxidant (IRGANOX® 1010), and 0.04 grams of a phosphonite antioxidant (IRGAFOX® P-EPQ). The solution was allowed to stir at room temperature until the ingredients were in solution. The solution had about 40% solids.

4. Sample 1.4

In this procedure, 1.2 grams of an ethene-norbornene copolymer (TOPAS® 8007) were dissolved in 5.92 grams of D-limonene along with 2.8 grams of a low molecular weight cycloolefin copolymer (TOPAS® Toner TM), 0.04 grams of a phenolic antioxidant (IRGANOX® 1010), and 0.04 grams of a phosphonite antioxidant (IRGAFOX® P-EPQ). The solution was allowed to stir at room temperature until the ingredients were in solution. The solution had about 40% solids.

5. Sample 1.5

For this procedure, 2.365 grams of an ethene-norbornene copolymer (TOPAS® 5013) were dissolved in 5.92 grams of D-limonene along with 1.635 grams of a low molecular weight cycloolefin copolymer (TOPAS® Toner TM), 0.04 grams of a phenolic antioxidant (IRGANOX® 1010), and 0.04 grams of a phosphonite antioxidant (IRGAFOX® P-EPQ). The solution was allowed to stir at room temperature until the ingredients were in solution. The solution had about 40% solids.

6. Sample 1.6

In this procedure, 2.2 grams of a hydrogenated norbornene-based copolymer prepared by ring-opening polymerization (ZEONOR® 1060, $T_g$ 100° C.; obtained from Zeon Chemicals, Louisville, Ky.) and 1.8 grams of a low molecular weight cycloolefin copolymer (TOPAS® Toner TM) were dissolved in 5.92 grams of cyclooctane (Aldrich, Milwaukee, Wis.). The solution was allowed to stir at room temperature until the ingredients were in solution. The solution had about 40% solids.

Example 2

Cycloolefin Copolymer Resins and Tackifier Blends

In this Example, formulations were made containing cycloolefin copolymers blended with various tackifiers. As in Example 1, antioxidants were added to some of the formulations.

1. Sample 2.1

In this procedure, 0.83 grams of an ethene-norbornene copolymer (TOPAS® 8007) were dissolved in 5.92 grams of D-limonene, along with 3.17 grams of a hydrogenated hydrocarbon resin (REGALITE® R1125; obtained from Eastman Chemical Co., Kingsport Tenn.), 0.04 grams of a phenolic antioxidant (IRGANOX® 1010), and 0.04 grams of a phosphonite antioxidant (IRGAFOX® P-EPQ). The solution was allowed to stir at room temperature until the ingredients were in solution. The solution had about 40% solids.

2. Sample 2.2

For this procedure, 0.7 grams of an ethene-norbornene copolymer (TOPAS® 8007) and 3.3 grams of a styrenated terpene resin (ZONATAC® NG98; obtained from Arizona Chemical, Jacksonville, Fla.) were dissolved in 5.92 grams of D-limonene, along with 0.04 grams of a phenolic antioxidant (IRGANOX® 1010), and 0.04 grams of a phosphonite antioxidant (IRGAFOX® P-EPQ). The solution was allowed to stir at room temperature until the ingredients were in solution. The solution had about 40% solids.

3. Sample 2.3

In this formulation, 1.9 grams of an ethene-norbornene copolymer (TOPAS® 5013) were dissolved in 5.92 grams of D-limonene, along with 2.1 grams of a cyclo-aliphatic hydrocarbon resin (ARKON® P-140; obtained from Arakawa Chemical USA Inc., Chicago, Ill.), 0.04 grams of a phenolic antioxidant (IRGANOX® 1010), and 0.04 grams of a phosphonite antioxidant (IRGAFOX® P-EPQ). The solution was allowed to stir at room temperature until the ingredients were in solution.

4. Sample 2.4

For this procedure, 2.42 grams of an ethene-norbornene copolymer (TOPAS® 5013) were dissolved in 5.92 grams of D-limonene, along with 1.58 grams of a cyclo-aliphatic hydrocarbon resin (PLASTOLYN® R-1140; obtained from Arakawa Chemical USA Inc., Chicago, Ill.), 0.04 grams of a phenolic antioxidant (IRGANOX® 1010), and 0.04 grams of a phosphonite antioxidant (IRGAFOX® P-EPQ). The solution was allowed to stir at room temperature until the ingredients were in solution. The solution had about 40% solids.

Example 3

Application, Bonding and Debonding, and Analysis

Figure 2:
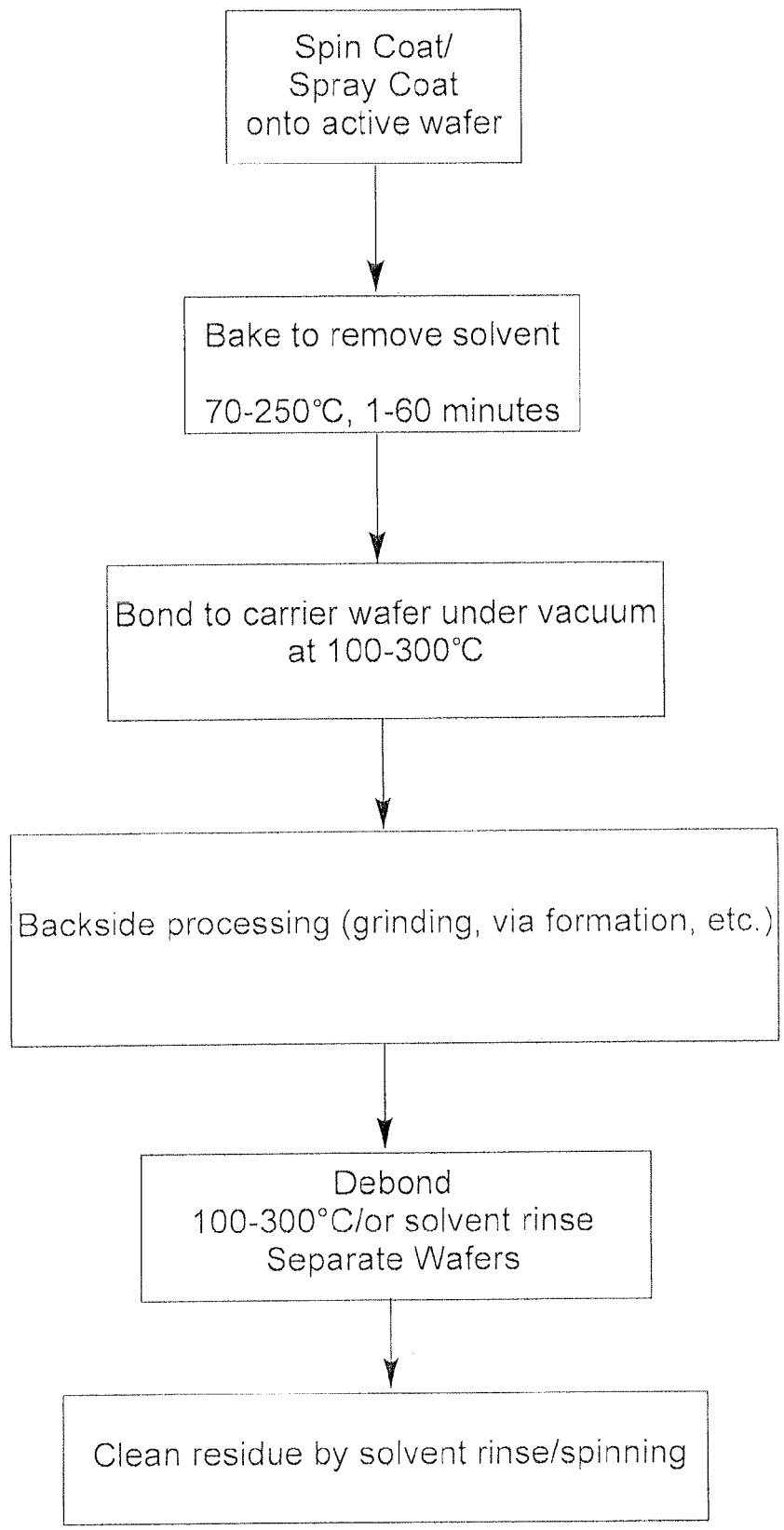
FIG. 2 is a flow diagram showing the typical process steps followed in the examples.

The formulations prepared in Examples 1 and 2 above were spin-coated onto various substrate wafers. After baking to evaporate the solvent and allowing the bonding composition to reflow, a second wafer was bonded to each coated wafer by applying pressure. A typical procedure for temporary wafer bonding using the bonding compositions is illustrated in FIG. 2. The bonded wafers were tested for mechanical strength, thermal stability, and chemical resistance. The wafers were tested for debonding by manually sliding them apart at acceptable temperatures. After debonding, the bonding composition residue was cleaned using a solvent rinse and spinning.

Figure 3:
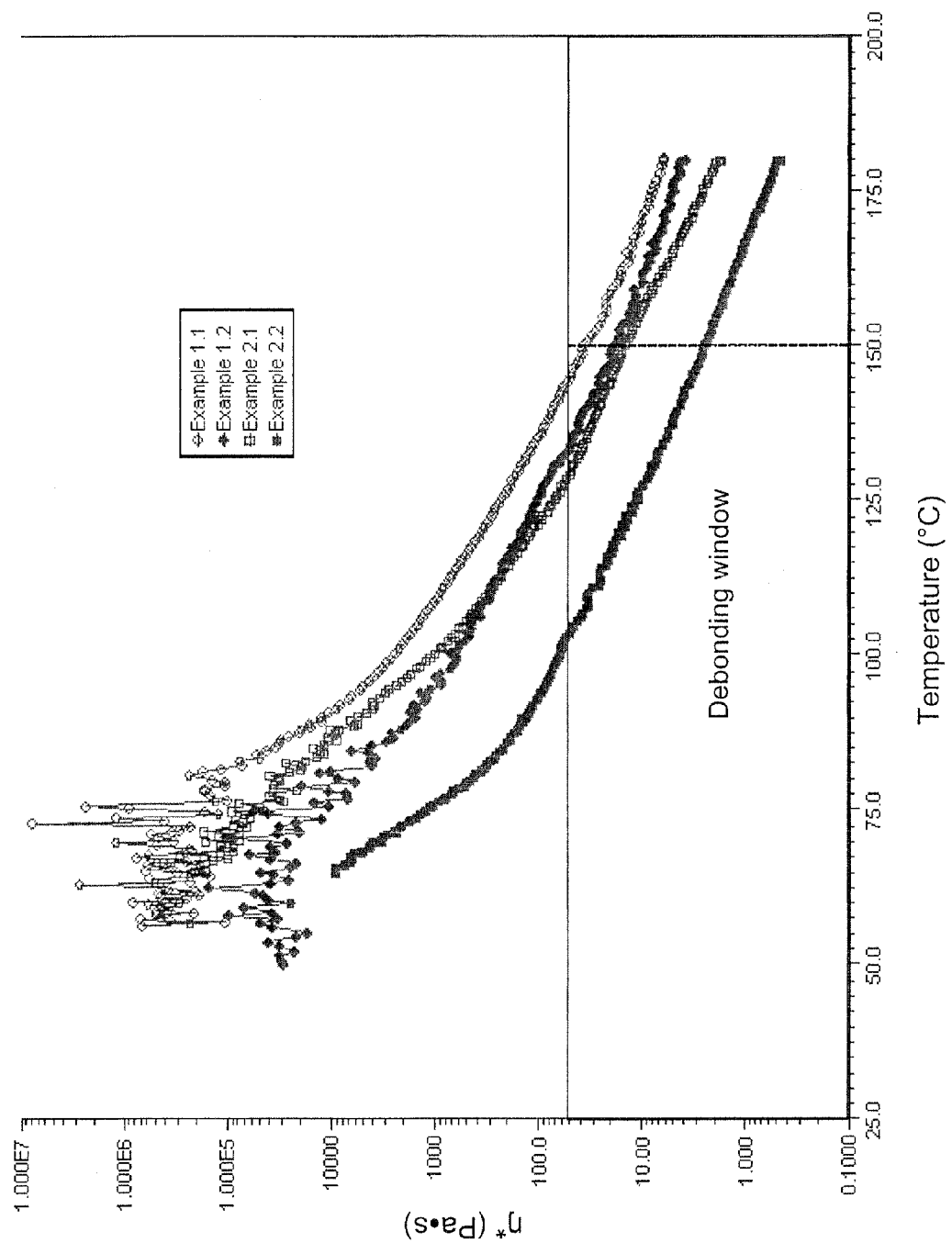
FIG. 3 is a graph depicting the rheological analysis results of bonding compositions according to the invention debonded at 150° C.
Figure 4:
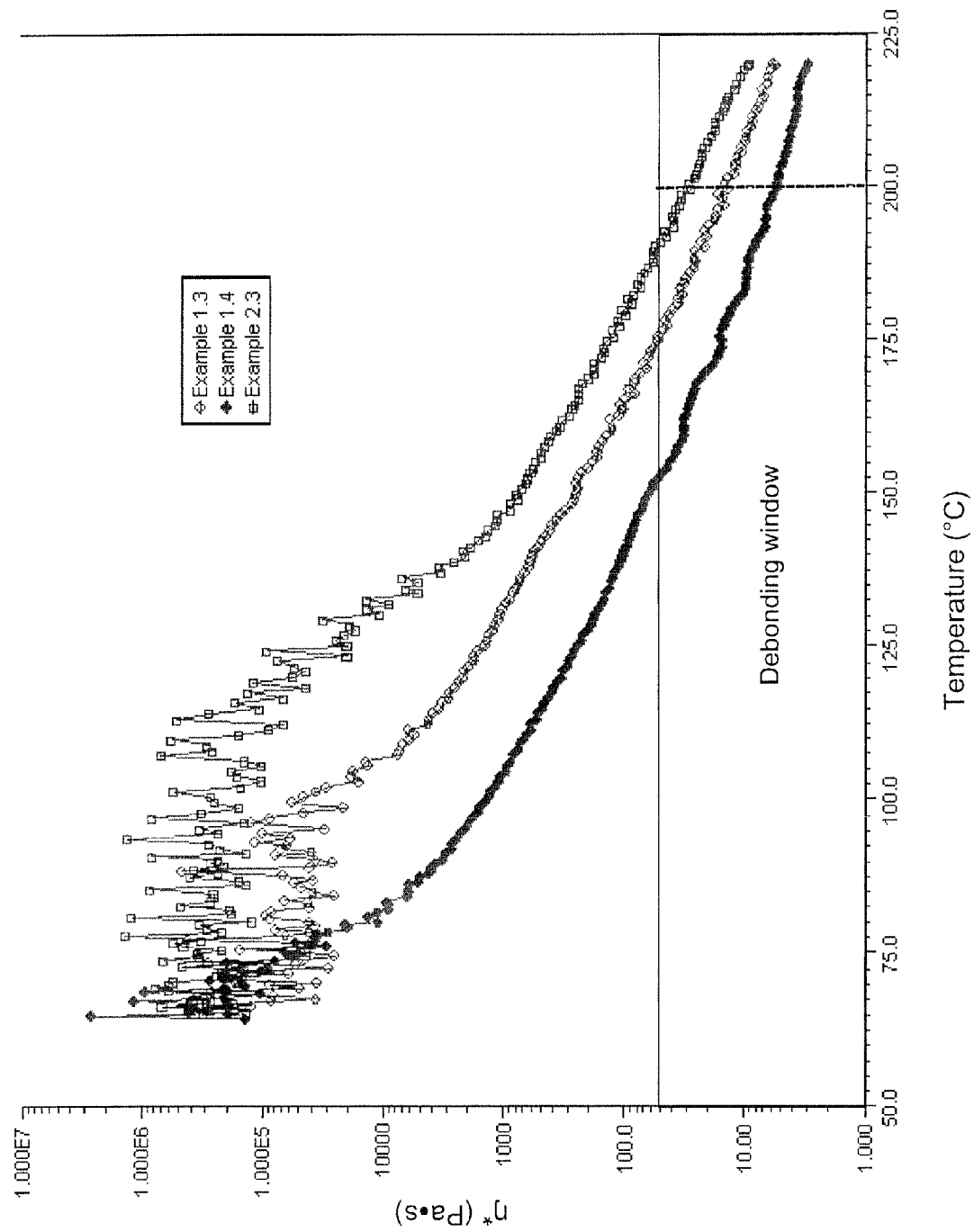
FIG. 4 is a graph depicting the rheological analysis results for bonding compositions according to the invention debonded at 200° C.
Figure 5:
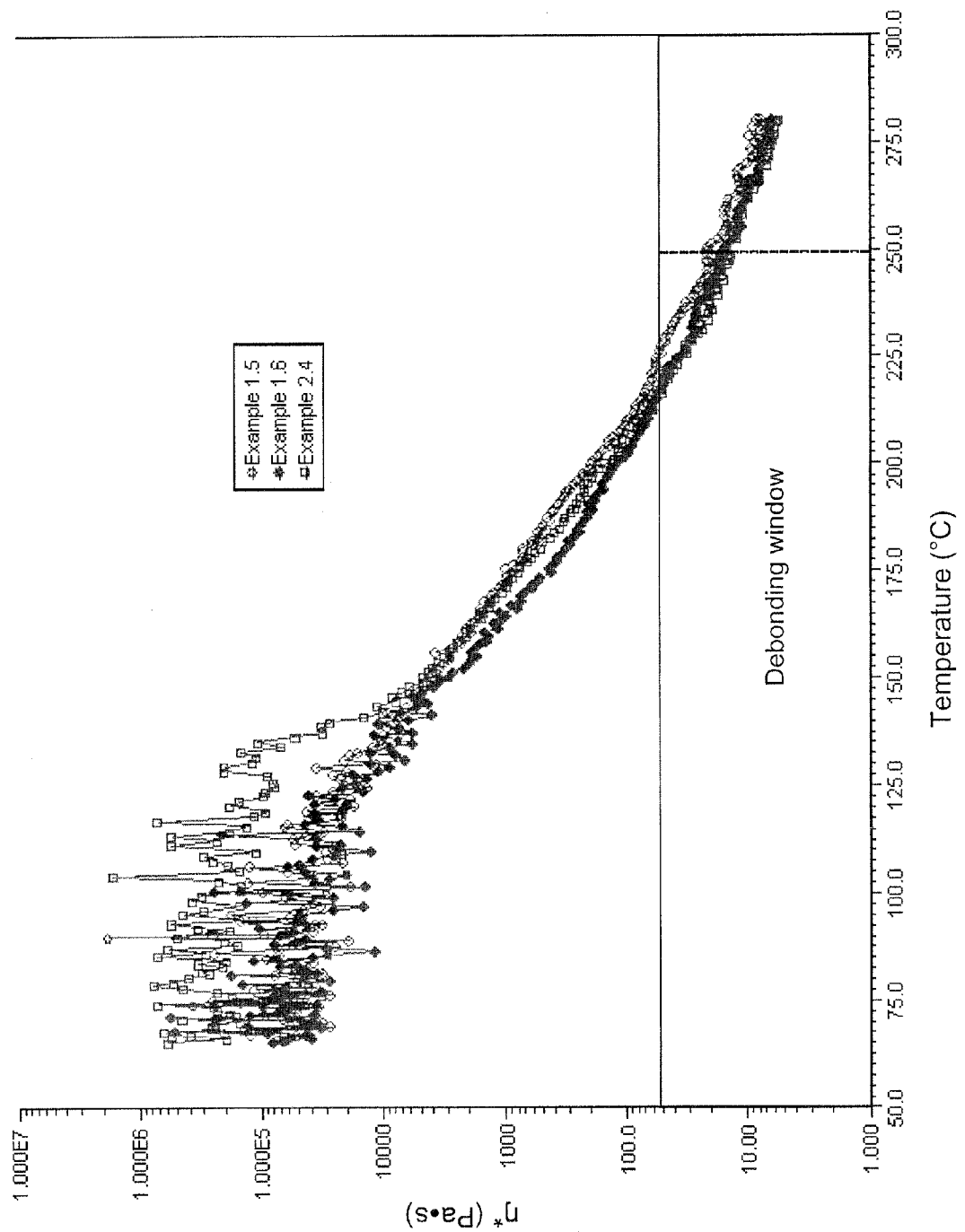
FIG. 5 is a graph depicting the rheological analysis results for bonding compositions according to the invention debonded at 250° C.

The rheological properties of each formulation from Examples 1 and 2 were tested. All of these materials were successfully tested for debonding. It was determined that the preferred debonding temperature for samples 1.1, 1.2, 2.1, and 2.2 was 150° C. The preferred debonding temperature for samples 1.3, 1.4, and 2.3 was 200° C., and the preferred debonding temperature for samples 1.5, 1.6, and 2.4 was 250° C. The storage modulus (G') and melt viscosity (η*, complex coefficient of viscosity) for each sample at their preferred debonding temperatures are reported below. The rheological data is also illustrated in FIGS. 3-5 for each debonding temperature.

TABLE 1

| Sample number | Storage Modulus, G' (Pa) | Viscosity, η* (Pa · s) | Debonding Temperature (° C.) |
|---|---|---|---|
| 1.1 | 25.5 | 35.0 | 150 |
| 1.2 | 9.6 | 16.7 | 150 |
| 1.3 | 8.0 | 13.9 | 200 |
| 1.4 | 3.5 | 5.1 | 200 |
| 1.5 | 16.3 | 20.1 | 250 |
| 1.6 | 8.1 | 15.1 | 250 |
| 2.1 | 24.9 | 14.5 | 150 |
| 2.2 | 1.3 | 2.4 | 150 |
| 2.3 | 21.7 | 28.7 | 200 |
| 2.4 | 5.5 | 14.1 | 250 |

Further studies on thermal stability and chemical resistance were also carried out on these compositions. Thermogravimetric analysis (TGA) was carried out on a TA Instruments thermogravimetric analyzer. The TGA samples were obtained by scraping off the spin-coated and baked bonding composition samples from Examples 1 and 2. For the isothermal TGA measurement, the samples were heated in nitrogen at a rate of 10° C./min., up to their preferred debonding temperature plus 50° C., and kept constant at that temperature for 1 hour to determine the thermal stability of the particular bonding composition. The isothermal measurements for each sample formulation are reported below in Table 2. For the scanning TGA measurement, the samples were heated in nitrogen at a rate of 10° C./min. from room temperature to 650° C.

TABLE 2

Isothermal thermogravimetric results - thermal stability (in $N_2$)

| Sample | Weight Loss (%) (Isothermal for 1 hour) | Isothermal temperature (° C.) |
|---|---|---|
| 1.1 | 0.123 | 200 |
| 1.2 | 0.847 | 200 |
| 1.3 | 1.268 | 250 |
| 1.4 | 0.764 | 250 |
| 1.5 | 0.752 | 300 |
| 1.6 | 0.596 | 300 |
| 2.1 | 5.496 | 200 |
| 2.2 | 4.650 | 200 |
| 2.3 | 5.737 | 250 |
| 2.4 | 5.191 | 300 |

As can be seen from the Table above, all of the COC-low molecular weight COC resin blends (Example 1) possessed the required thermal stability at least up to 300° C. and exhibited minimal weight loss (<1.5-wt %). The COC-tackifier blends (Example 2) had an average weight loss of about 5-wt % when maintained at the testing temperature. However, as shown in Table 3, below, the 1-wt % weight loss temperatures were higher than their respective bonding/debonding temperatures, suggesting sufficient thermal resistance for wafer-bonding applications.

TABLE 3

Scanning thermogravimetric results

| Sample | Temperature at 1.0% weight loss (° C.) | Debonding Temperature (° C.) |
|---|---|---|
| 2.1 | 214 | 150 |
| 2.2 | 223 | 150 |
| 2.3 | 228 | 200 |
| 2.4 | 252 | 250 |

To determine chemical resistance, two silicon wafers were bonded using the particular bonding composition to be tested. The bonded wafers were put into chemical baths of N-Methyl-2-Pyrrolidone (NMP) or 30% by weight KOH at 85° C., and concentrated sulfuric acid at room temperature to determine chemical resistance. The bond integrity was visually observed after 45 minutes, and the stability of the bonding composition against the respective chemical was determined. All bonding compositions retained the bond integrity.

Having described the invention, the following is claimed:

1. A wafer bonding method comprising:
    applying a bonding composition to at least one of a first substrate and a second substrate by spin-coating, said layer being a void-free and uniform material across its thickness formed of the same composition; and
    bonding the first and second substrates together via the bonding layer,
    wherein the bonding layer is applied in that the thickness T of the bonding layer varies by less than 20% and more than 9% across the length of the second substrate.

2. The method of claim 1, wherein the first substrate is an active wafer with an active surface comprising topographical features, on which the layer is applied.

3. The method of claim 2, wherein the bonding composition flows into and over the topographical features.

4. The method of claim 2, wherein the bonding layer forms a uniform layer over the topography of the active surface.

5. The method of claim 1, wherein said composition comprises a first cycloolefin copolymer dispersed or dissolved in a solvent system and a second cycloolefin copolymer, wherein a tackifier is not present in said composition.

6. A wafer bonding method comprising:
    applying a bonding composition to at least one of a first substrate and a second substrate by spin-coating, said layer being a uniform material across its thickness formed of the same composition, wherein the bonding layer is applied in that the thickness T of the bonding layer varies by less than 20% and more than 9% across the length of the coated substrate, and
    bonding the first and second substrate together via the bonding layer.

* * * * *